United States Patent [19]

Kawakami

[11] Patent Number: 5,349,501
[45] Date of Patent: Sep. 20, 1994

[54] ELECTRONIC DEVICE ADAPTIVE TO MOUNTING ON A PRINTED WIRING BOARD

[75] Inventor: Youji Kawakami, Tokyo, Japan

[73] Assignee: Nippon Steel Corporation, Tokyo, Japan

[21] Appl. No.: 958,622

[22] Filed: Oct. 9, 1992

[30] Foreign Application Priority Data

Oct. 11, 1991 [JP] Japan .................. 3-292083

[51] Int. Cl.$^5$ .............................. H01R 9/00
[52] U.S. Cl. .................... 361/776; 361/749; 361/760; 361/813; 257/692; 257/787; 174/52.4
[58] Field of Search ............... 361/388, 386, 395, 398, 361/400, 401, 406, 408, 411, 421, 723, 736, 749, 760, 761, 774, 776, 779, 813; 257/692, 693, 694, 695, 696, 787, 788; 174/52.2, 52.4

[56] References Cited

U.S. PATENT DOCUMENTS

| | | | |
|---|---|---|---|
| 4,873,615 | 10/1989 | Grabbe | 361/395 |
| 5,065,281 | 11/1991 | Hernandez et al. | 361/388 |
| 5,191,404 | 3/1993 | Wu et al. | 257/724 |

FOREIGN PATENT DOCUMENTS

| | | |
|---|---|---|
| 58-54499 | 12/1983 | Japan . |
| 4-7862 | 1/1992 | Japan . |
| 4-57349 | 2/1992 | Japan . |

*Primary Examiner*—Leo P. Picard
*Assistant Examiner*—Young Whang
*Attorney, Agent, or Firm*—Kenyon & Kenyon

[57] ABSTRACT

An electronic device adaptive to mounting on a printed wiring board, which has outer leads that are not subject to be deformed by external force, which helps improve positioning precision when it is mounted, and which can be transported at a reduced cost. A plurality of conductor leads connected to an electronic circuit provided in the electronic device extend along a peripheral surface of the package, and at least the ends of the conductor leads are fixed to the peripheral surface of the package to constitute input/output terminals of the electronic circuit. Preferably, the conductor leads are formed on a flexible film, bent along the peripheral surface of the package together with the film and are fixed to a bottom surface of the package via the film. Preferably, furthermore, a film in the form of a tape is employed, and a plurality of packages are arranged and supported on the film while maintaining a predetermined distance between one another.

9 Claims, 6 Drawing Sheets

Fig. 1(A)
(PRIOR ART)
Fig. 1(B)
(PRIOR ART)
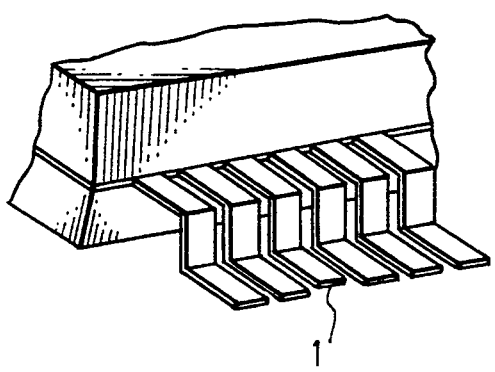
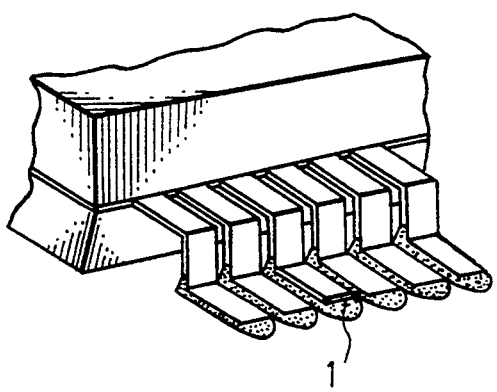
Fig. 2(A)
(PRIOR ART)
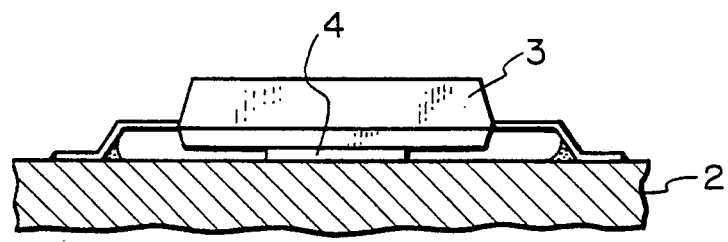
Fig. 2(B)
(PRIOR ART)
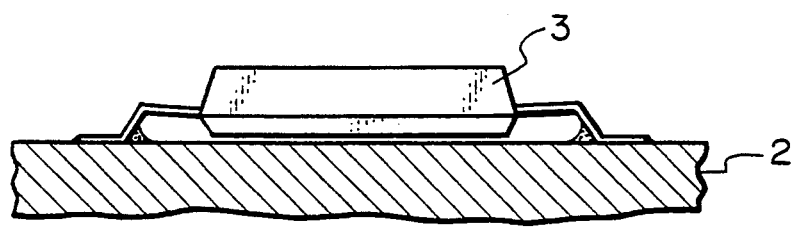

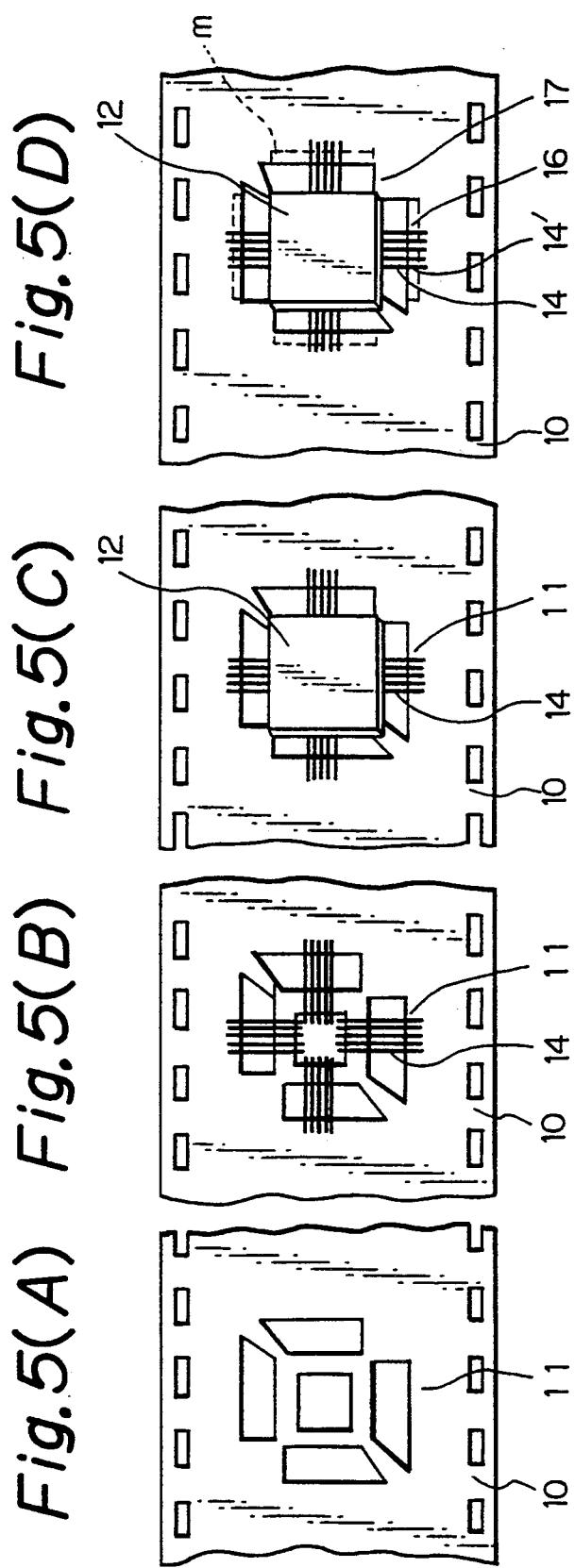

ELECTRONIC DEVICE ADAPTIVE TO MOUNTING ON A PRINTED WIRING BOARD

BACKGROUND OF THE INVENTION

1. FIELD OF THE INVENTION

The present invention relates to an electronic device adaptive to mounting on a circuit board, or a printed wiring board (PWB) and, particularly, to an electronic device which facilitates the mounting on the circuit board and transportation thereof by changing the shape of outer leads of an electronic device which has many leads.

2. DESCRIPTION OF RELATED ART

As a package for a semiconductor element such as an IC chip, an LSI chip or the like, there has heretofore been known a TAB (Tape Automated Bonding) type package in which the semiconductor element is mounted on a thin tape film and is molded with a resin. The tape film used for the package is chiefly composed of a polyimide resin and has a thickness of as small as about 100 μm. On the tape film is laminated a copper foil which is then subjected to etching to form a number of leads. The ends on one side of the leads are called inner leads and are connected to the LSI chip by the bumps or the like and at the ends on the other side thereof outer leads extend that connect to the circuit board.

The TAB type package can have pins in a number which is greater than that of a conventional plastic flat package, i.e., the TAB type package can have, for example, about 300 to 400 pins or more than about 1000 pins maintaining a pitch among the leads of as narrow as, for example, 50 μm. Therefore, the TAB type package gives such an advantage that a circuit designer is allowed to design a circuit without worrying much about the limitation in the number of terminals of an IC element. Moreover, since the number of terminals can be increased per a single IC element, it is possible to decrease the number of IC packages required on the board contributing to reducing the size and weight of electronic devices.

However, employment of such an electronic device packaging of the IC chip, LSI chip or the like into the TAB type package, gives rise to the occurrence of defects as described below.

First, such an electronic device has very fine leads which, therefore, have limited mechanical strength. Therefore, the leads are subject to being deformed while the electronic devices are being transported or when the leads are being formed. As shown in FIG. 1(A), for instance, a defective connection takes place (see FIG. 1(B)) if the leads 1 are deformed and float. Therefore, the electronic devices must be handled with extreme care.

To transport the electronic devices, therefore, a method has been employed, in which each electronic device is contained in a special carrier or a supporting tray, however, the probability of deformation of the leads due to vibration during transportation of the electronic device still exists. Therefore, a carry-in method has usually been put into practice according to which an electronic device without the completely finished leads but with the lead shape, i.e., a half-finished electronic device is placed on the carrier tape and is shipped, and the electronic device is cut off from the tape at the moment when it is to be mounted on a circuit board and then the leads are formed. In this case, however, the manufacturer who mounts the device on the printed board must be equipped with an apparatus for forming the leads. In either case, therefore, carrying the electronic devices involves cumbersome operation.

Second, when the electronic device is to be mounted on the circuit board, even when the leads are not deformed, it is difficult to position a number of leads on the circuit board while maintaining high precision, since the leads are very fine. That is, when the electronic device is mounted using a conventional automatic mounting device, it is necessary to mount it on the circuit board under the condition in which the ends of the leads are maintained flat and uniform by holding the whole device so that the leads are not deformed.

Third, since the leads have limited mechanical strength, the electronic device as a whole cannot be supported by the leads after it is mounted on the circuit board. As shown in FIG. 2(A), therefore, the electronic device must be mounted by placing an adhesive agent 4 in a gap between the circuit board 2 and the electronic device 3. If no adhesive agent is placed in the above gap (FIG. 2(B)), the electronic device 3 moves so that stability is lost and leads are broken due to vibration during transporting. When semiconductor devices that was not adhered to the board were subject to a vibration test in compliance with Japanese Industrial Standards (JIS C 7022), the leads were broken in almost all of the devices.

SUMMARY OF THE INVENTION

The present invention was accomplished in order to solve the above-mentioned inherent defects in the conventional electronic devices for packaging IC chips, LSI chips or the like, and inconveniences stemming therefrom.

The object of the present invention is directed to such an electronic device, and to providing an electronic device which is obtained by using, for example, a tape film which does not permit the outer leads to be deformed by vibration during transportation and which enables the positioning to be accomplished while maintaining high precision when it is to be mounted on a circuit board.

Another object of the present invention is to provide an electronic device which can be supplied as a completed product from the manufacturer of electronic devices to a manufacturer who mounts it on the printed board, and which can be transported at a reduced cost.

According to the present invention, there is provided an electronic device adaptive to mounting on a circuit board, comprising a plurality of conductor leads extending from an electronic circuit provided in the device that run along a peripheral surface of a package accommodating the electronic circuit, at least the ends of the conductor leads being fixed to the peripheral surface of the package to constitute input/output terminals of the electronic circuit.

Preferably, the conductor leads are formed on a flexible film made from a polyimide, bent along the peripheral surface of the package together with the film as a unitary structure, and are fixed to a predetermined peripheral surface of the package via the film. In this case, it is desired that the film has the form of a tape, and a plurality of the packages are arranged and supported on the film maintaining a predetermined distance.

The above plurality of conductor leads may be realized in any form. For instance, first conductor leads that are connected to the electronic circuit provided in the device and second conductor leads that constitute the input/output terminals of the electronic circuit may be connected together to form the aforementioned plurality of conductor leads, the second conductor leads being formed along the peripheral surface of the package and at least the ends of the second conductor leads being fixed at a predetermined position on the peripheral surface of the package, thereby to constitute the input/output terminals of the electronic circuit. Furthermore, the second conductor leads may be formed by plating.

According to the above-mentioned constitution, the outer leads do not spread to the outside of the package, and the input/output terminals of the electronic device can be constituted on a predetermined peripheral surface of the package maintaining a pitch among the leads which are formed, for example, on a film. Therefore, the outer leads are not deformed by the external force and can be very precisely positioned on a circuit board. The operation, in this case, is carried out without the need of cutting the individual packages off the tape film on which the packages are arranged while maintaining a predetermined distance, and the completed electronic device is kept stably supported on the tape film. Thus, the electronic devices in a complete form can be stably supplied to a manufacturer who mounts them on the printed boards, and the cost of transportation can be greatly decreased.

According to the present invention as described above, there is provided an electronic device that eliminates the aforementioned defects inherent in the conventional electronic devices and inconveniences stemming therefrom. Furthermore, the electronic device according to the present invention can be adapted to an application in which the leads are simply connected to an IC chip, an LSI chip or the like, to an application in which such a chip is contained in a package and to which leads are connected in the package, and to any other similar applications.

Other objects and features of the present invention will be clearly understood by those skilled in the art on consideration of the accompanying drawings and the description of the specification which discloses embodiments of the invention that can be variously changed or modified or rationalized within the scope of the appended claims without departing from the spirit of the present invention.

BRIEF DESCRIPTION OF THE DRAWINGS

FIGS. 1(A)-1(B) are a perspective view of a lead portion in a conventional electronic device;

FIGS. 2(A)-2(B) are a side view of a condition where a conventional electronic device is mounted on a printed board;

FIGS. 5(A)-5(D) are a diagram which schematically illustrates the steps for forming the leads of the electronic device of FIG. 3;

DESCRIPTION OF THE PREFERRED EMBODIMENTS

Figure 3:
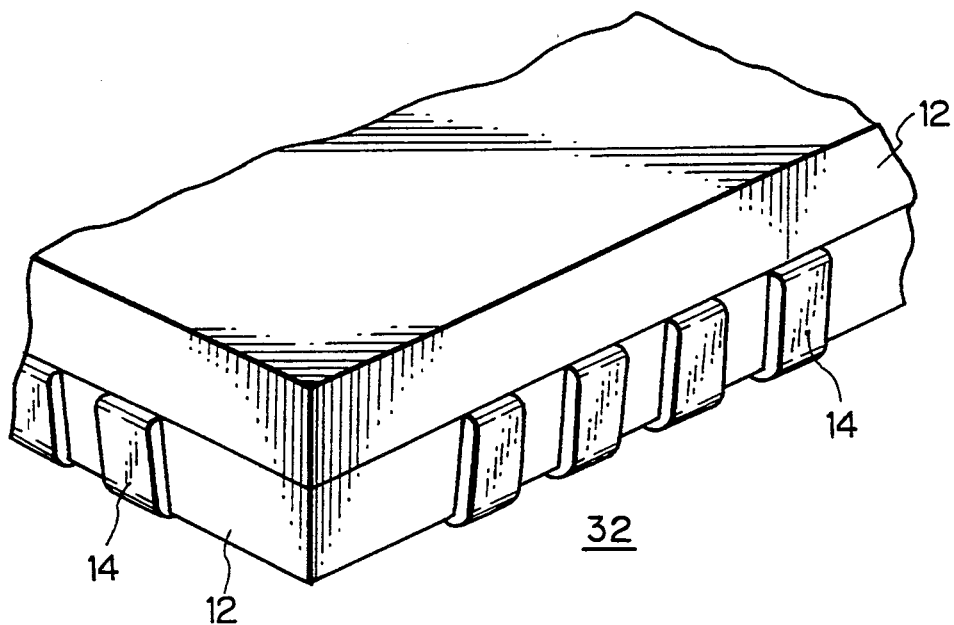
FIG. 3 is a perspective view of a lead portion of an electronic device according to a first embodiment of the present invention.

Embodiments of the electronic device of the present invention will now be described with reference to the drawings in which the same reference numerals denote similar portions.

Figure 4:
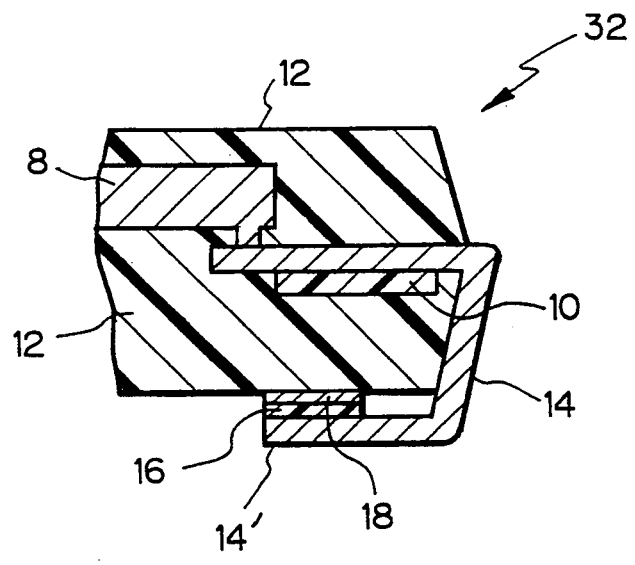
FIG. 4 is a sectional view of the lead portion of the electronic device of FIG. 3.

FIG. 3 is a perspective view showing a portion of a first embodiment of the present invention. FIG. 4 is a sectional view thereof. In FIG. 3, an electronic device 32 is a TAB type package in which an LSI chip is mounted on the TAB film. The interior of the TAB type package 32 can be fabricated by using known technology. For instance, leads 14 are formed by etching on a thin tape film 10 made from a flexible substrate material such as a polyimide, an LSI chip 8 is mounted on the inner lead side of the leads 14, and the inner leads and the LSI chip are sealed with an epoxy resin.

As seen in FIG. 4, a feature of TAB type package 32 resides in the form of outer leads 14 protruding through a resin mold portion 12, the outer leads 14 extending toward the bottom surface of the package 12 along the peripheral side surface thereof. The ends 14' of the leads 14 are fixed with an adhesive agent 18 to the bottom surface of the resin portion 12 via a small piece 16 of the tape film 10 thereby to constitute input/output terminals that connect to the circuit board.

The method of fabricating the TAB type package 32 is consecutively shown in FIGS. 5 and 6. Referring first to FIG. 5(A), the tape film 10 is subjected to the punching of a predetermined shape. On the tape film 10, the small piece 16 adhered to the bottom surface of the package 12 in FIG. 4 corresponds to a position designated at 11. Then, a copper foil is laminated on the tape, leads 14 are formed by etching as shown in FIG. 5(B), and surfaces of the leads 14 are plated with gold, silver or tin. After the leads 14 are formed on the tape film, the inner leads and the LSI chip are bonded together (not shown) by a known method, and a portion where the LSI chip is mounted is sealed with a resin to thereby constitute a resin portion 12 (see FIG. 5(C)).

In a next step of FIG. 5(D), the tape film 10 is cut at portions indicated by dotted lines m. The ends 14' of the outer leads after being cut, and a piece of the tape film 16 form a unitary structure as shown, and the resin portion 12 of the TAB type package is supported by four portions 17 of the tape film.

Figure 6A:
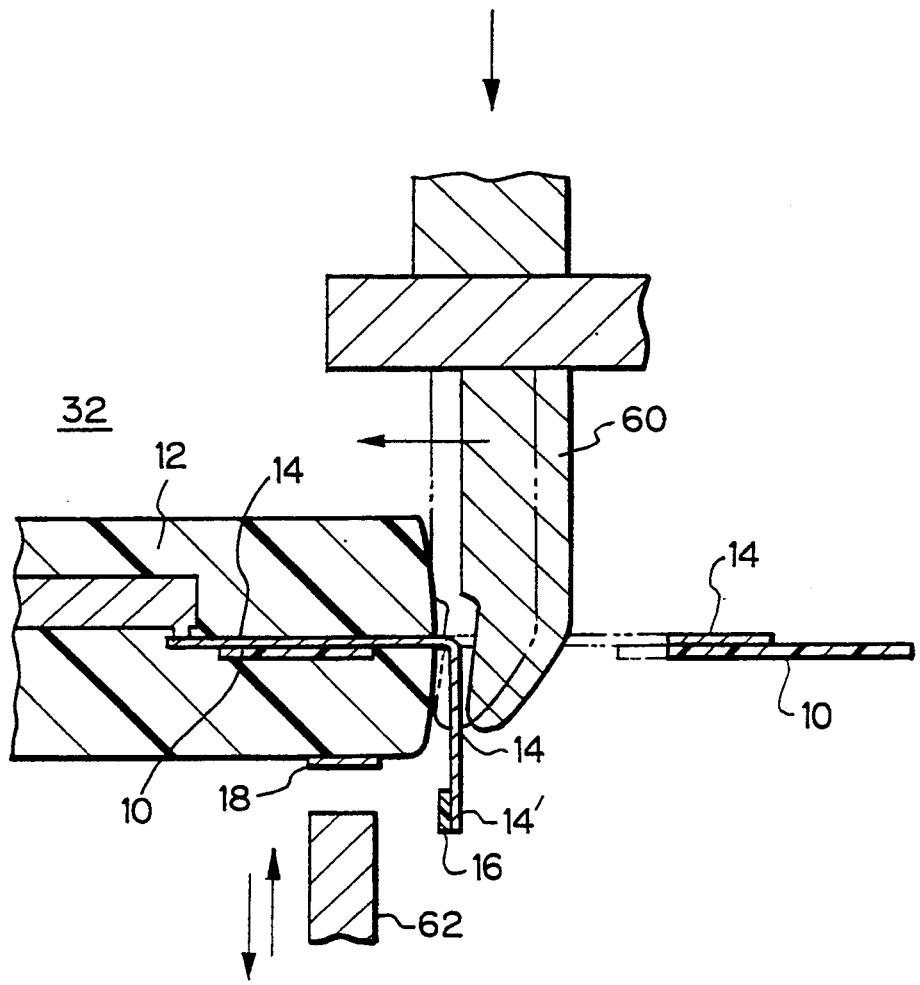
FIG. 6 is a sectional view illustrating the steps for bending the leads of the electronic device of FIG. 3.
Figure 6B:
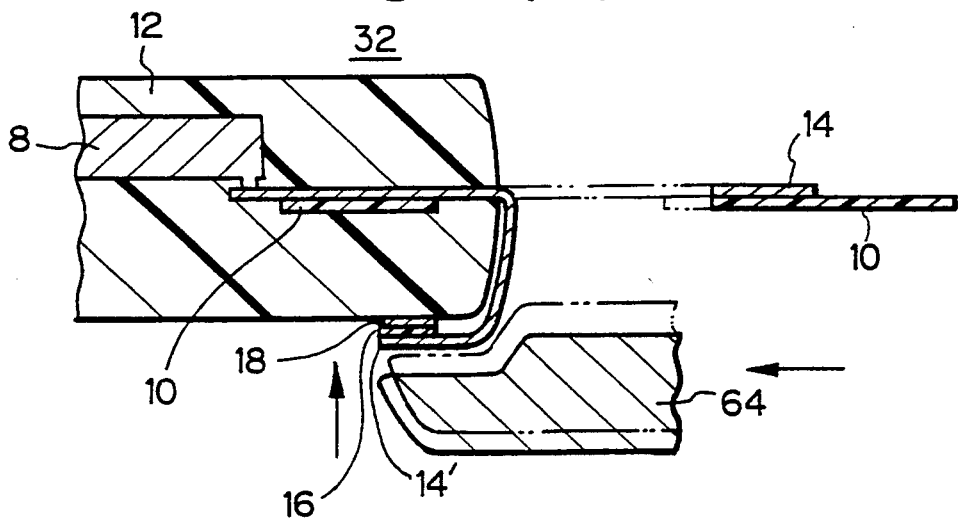

FIG. 6 shows a step which the ends 14' of the thus formed outer leads are bent along the peripheral side surface of the resin portion 12 and are fixed to the bottom portion of the resin portion 12. Referring to FIG. 6(A), a first forming punch 60 comes down from the upper side of the surface of the tape film 10 through a hole and downwardly bends all of the outer leads 14. Then, the first forming-punch 60 which is in contact with the outer leads 14 horizontally moves toward the side surface of the resin portion 12 such that the outer leads 14 are intimately contacted to the side surface of the resin portion. At the same time, a nozzle 62 extends from the lower side of the bottom of the resin portion 12 and applies an adhesive agent 18 to a predetermined position on the bottom of the resin portion 12. Under this condition, a second forming-punch 64 bends the outer leads 14 along the bottom surface of the resin portion as shown in FIG. 6(B), so that a piece of tape film 16 is adhered to the bottom surface of the resin portion where the adhesive agent 18 is applied. Thus, the ends 14' of the outer leads that are fixed by adhesion constitute input/output terminals on the bottom surface of the resin portion. The forming punches 60 and 64 can be moved by a mechanical means such as robot or the like.

In the TAB type package 32 as described above, a number of leads 14 are fixed together with a piece of tape film 16 and constitute input/output terminals in the form of leads formed by etching on the bottom of the resin portion 12. Therefore, the TAB type package can be easily positioned when it is being mounted on a printed board. In this TAB type package 32, furthermore, the outer leads 14 do not extend on the printed circuit board, and the TAB type package device occupies a reduced area on the surface of the printed board.

Figure 7:
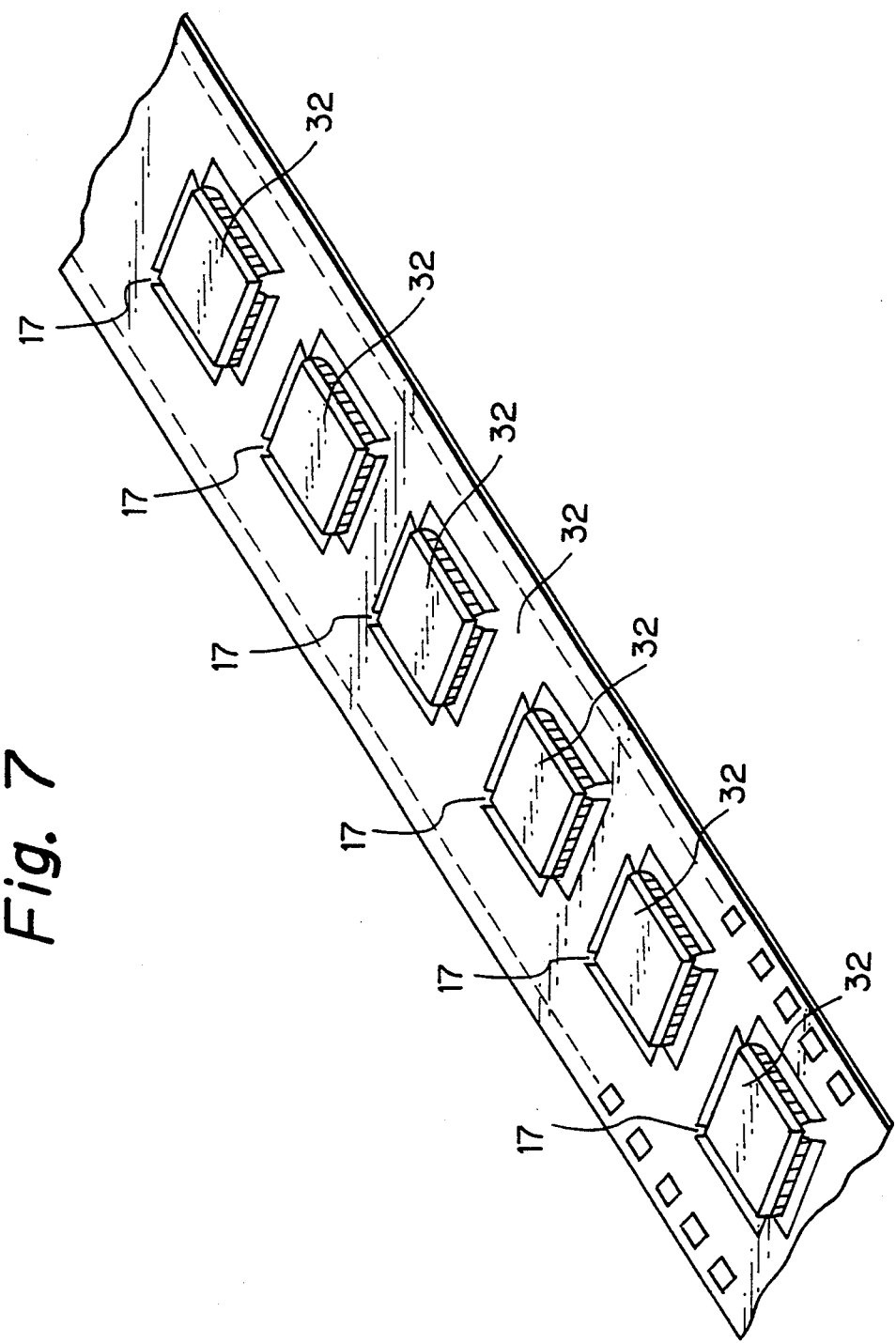
FIG. 7 is a perspective view showing the condition where the electronic device of FIG. 3 is completed.

Furthermore, the TAB type packages 32 are produced without being separated away from the tape film 10, and the TAB type packages 32 are arranged on the tape film 10 while maintaining a predetermined distance as shown in FIG. 7 and are shipped as complete products in a state where they are supported on the tape film 10. The TAB type packages 32 are separated away from the tape film 10 when they are to be actually mounted on a printed board, and are soldered onto the printed boards like conventional chip products. Therefore, the transportation does not require strict protection of leads, and the manufacturer who mounts the device on the printed board is required neither to form the outer leads nor to charge the adhesive agent between the printed board and the TAB type package.

Next, described below is a second embodiment of the TAB type package of the present invention. According to this embodiment, the outer leads and the input/output terminals of the above first embodiment are formed by plating, and the method of fabrication thereof is shown in sectional views of FIG. 8.

Figure 8A:
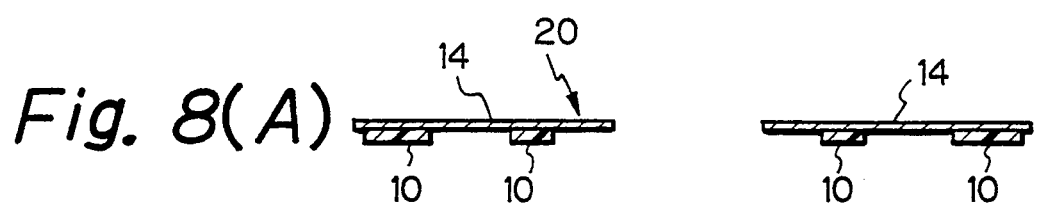
FIGS. 8(A)-8(F) are a sectional diagram illustrating the steps for fabricating an electronic device according to the second embodiment of the present invention.
Figure 8B:
Figure 8C:
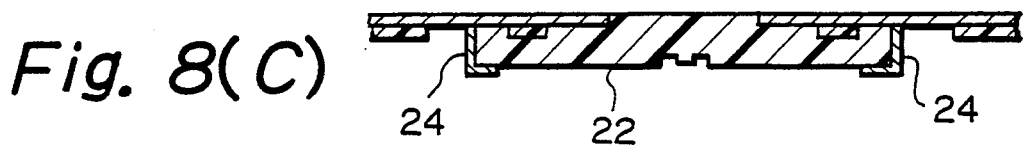

As shown in FIG. 8(A), first, leads 14 of a predetermined pattern are formed on a flexible film carrier 10 such as of a polyimide to constitute a TAB tape 20. Referring next to FIG. 8(B), the opposite side of the film carrier 10 is molded with a thermoplastic resin to form a base 22. Thus, the leads 14 on the TAB tape 20 are fixed to the base 22 while maintaining a predetermined pattern.

Then, second leads 24 are formed that are continuous from the side surface to the bottom surface of the base 22 to meet the positions of the leads 14. The leads 14, therefore, are electrically connected to the leads 24. This can be done, for example, by masking the periphery of the base followed by nonelectrolytic plating, or by forming through holes at portions for forming the leads and subjecting the whole lead-forming portion to the nonelectrolytic plating and then removing the plating but leaving the plating on the through hole portions only (see FIG. 8(C)). The material of the second leads 24 may be an electrically conducting material such as copper, gold, or materials which contain these as chief components.

Figure 8D:
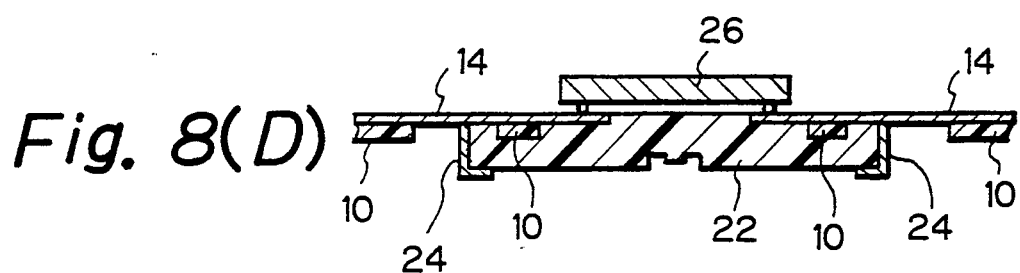
Figure 8E:
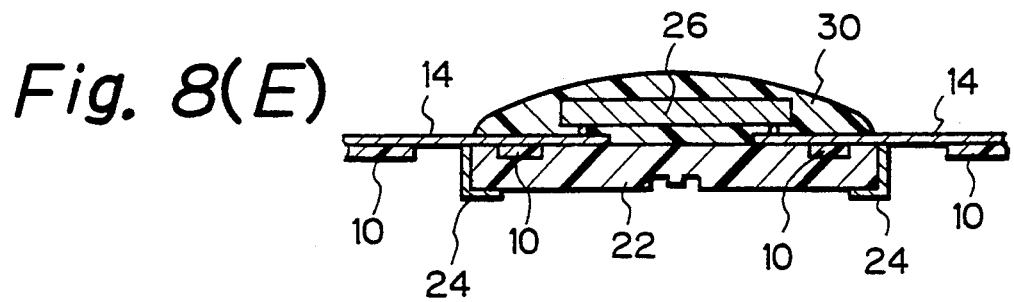
Figure 8F:
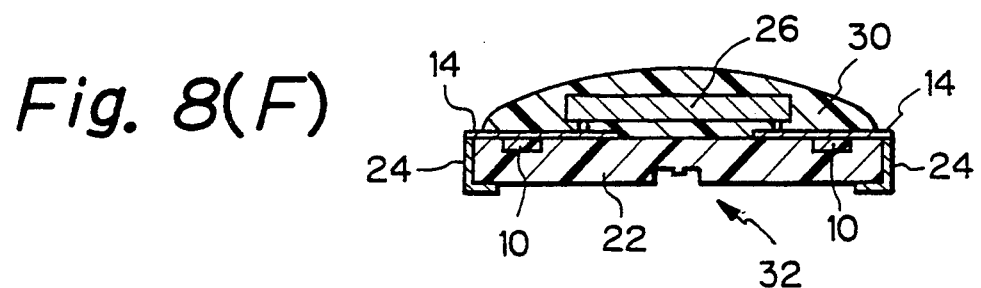

In a step of FIG. 8(D), an IC chip 26 is mounted at a predetermined position on the TAB tape 20, and the terminals of the IC chip 26 and inner leads of the leads 14 are electrically connected together. Thereafter, the IC chip 26 and the periphery thereof are molded with an epoxy resin 30 in order to protect the IC chip 26 (see FIG. 8(E)). Finally, in FIG. 8(F), excess portions of the leads 14 on the surface of the TAB tape 20 are cut to complete the TAB type package. Excess portions only of the leads 14 are cut, and the TAB type package is supported at four end portions of the TAB tape 20 like in the above first embodiment, i.e., the TAB type package are arranged maintaining a predetermined distance throughout the rolled TAB tape 20.

As described above, the TAB type package of this embodiment is produced by using a chemical method and solves the aforementioned inconveniences inherent in the conventional electronic devices by utilizing its structural feature like that of the first embodiment described above. In the semiconductor device of this embodiment, furthermore, the leads are formed by the plating method presenting an advantage in that the input/output terminals can be constituted at any desired position on the peripheral surface of the package.

As mentioned above, the present invention solves the aforementioned defects of the conventional TAB type package and inconveniences stemming therefrom and, thus, provides a TAB type package that does not permit outer leads to be deformed by external force or the like and that can be very precisely positioned on the circuit board. Moreover, there is provided a TAB type package that can be supplied in a complete and stable form to manufacturers who mount it on a printed board, and that can be transported at a greatly reduced cost.

I claim:

1. A semiconductor package adaptive to mounting on a circuit board, comprising:
   a semiconductor element;
   a substrate made from a flexible material and including a carrying portion for mounting the semiconductor element thereon;
   a plurality of leads formed on the substrate, electrically connected to the semiconductor element, and extending toward predetermined position on the substrate; and
   a resin portions molded onto said semiconductor element, the substrate, and portions other than an end portions of the leads;
   wherein at least ends of said leads remaining in an exposed state are adhered to a surface of said resin portion.

2. The semiconductor package according to claim 1, wherein said end portions of the leads remaining in the exposed state are bent along a peripheral surface of the molded resin portion.

3. The semiconductor package according to claim 1, wherein said end portions of the leads remaining in the exposed state are bend along a peripheral surface of the mounted resin portion and adhered to side and bottom surfaces of the molded resin portion by an adhesive agent.

4. The semiconductor package according to claim 1, wherein said at least the end of said lead remaining in the exposed state is adhered to the surface by an adhesive means.

5. A semiconductor package adaptive to mounting on a circuit board comprising;
   a semiconductor element;
   a substrate made from a flexible material and including a carrying portion for mounting the semiconductor element thereon;
   a first lead formed on the substrate, electrically connected to said semiconductor element, and extending toward a predetermined position on the substrate;

a resin portion molded onto said semiconductor element, the substrate, and portions other than an end portion of the first lead; and a second lead electrically connected to the first lead at the end portion thereof and being exposed on the surface of the molded resin, said second lead extending along the resin portion, with at least end of said second lead being adhered to a peripheral surface of said resin portion.

6. The semiconductor package according to claim 5, wherein said second lead is formed by plating the surface of said molded resin.

7. The semiconductor package according to claim 5, wherein said second lead is bent along the surface of the resin portion.

8. The semiconductor package according to claim 5, wherein said second lead is bent along a peripheral surface of the molded resin portion and is adhered to side and bottom surfaces of the molded resin portion by an adhesive agent.

9. The semiconductor package according to claim 5, wherein said at least another end of said second lead is adhered to the surface by an adhesive means.

* * * * *

UNITED STATES PATENT AND TRADEMARK OFFICE
CERTIFICATE OF CORRECTION

PATENT NO. : 5,349,501
DATED : September 20, 1994
INVENTOR(S) : Youji KAWAKAMI

It is certified that error appears in the above-indentified patent and that said Letters Patent is hereby corrected as shown below:

Column 2, line 24, change "was" to --were--.

Column 6, line 5, change "age" to --ages--.

Column 6, line 39, delete "a" at beginning of line.

Column 6, line 40, delete "an" at end of line.

Column 6, line 51, change "bend" to --bent--.

Signed and Sealed this

Fourteenth Day of March, 1995

Attest:

BRUCE LEHMAN

Attesting Officer

Commissioner of Patents and Trademarks